(12) United States Patent
Moschiano et al.

(10) Patent No.: US 8,194,448 B2
(45) Date of Patent: Jun. 5, 2012

(54) TECHNIQUE TO REDUCE FG-FG INTERFERENCE IN MULTI BIT NAND FLASH MEMORY IN CASE OF ADJACENT PAGES NOT FULLY PROGRAMMED

(75) Inventors: Violante Moschiano, Bacoli (IT); Giovanni Santin, Rieti (IT)

(73) Assignee: Intel Corporation, Santa Clara, CA (US)

( * ) Notice: Subject to any disclaimer, the term of this patent is extended or adjusted under 35 U.S.C. 154(b) by 295 days.

(21) Appl. No.: 12/647,317

(22) Filed: Dec. 24, 2009

(65) Prior Publication Data
US 2011/0157980 A1    Jun. 30, 2011

(51) Int. Cl.
*G11C 16/04*    (2006.01)

(52) U.S. Cl. .......... 365/185.03; 365/185.12; 365/185.18

(58) Field of Classification Search ............. 365/185.03, 365/185.12, 185.17, 185.18, 185.24
See application file for complete search history.

(56) References Cited

U.S. PATENT DOCUMENTS 7,457,155 B2 *  11/2008  Nazarian ................... 365/185.02
7,567,455 B2 *  7/2009   Khaef ....................... 365/185.02

* cited by examiner

*Primary Examiner* — Gene Auduong
(74) *Attorney, Agent, or Firm* — Cool Patent, P.C.; Joseph P. Curtin

(57) ABSTRACT

A method of reducing floating gate-floating gate interference in programming NAND flash memory is provided. Prior to programming an upper page of a memory cell, the method includes checking whether adjacent pages of near memory cells have been programmed. The method may program adjacent pages of near memory cells that have not been programmed.

20 Claims, 5 Drawing Sheets

| WL | Lpe | Mpe | Upe | Lpo | Mpo | Upo |
|----|-----|-----|-----|-----|-----|-----|
| 10 | 48 | 56 | 64 | 49 | 57 | 65 |
| 9 | 42 | 50 | 58 | 43 | 51 | 59 |
| 8 | 36 | 44 | 52 | 37 | 45 | 53 |
| 7 | 30 | 38 | 46 | 31 | 39 | 47 |
| 6 | 24 | 32 | 40 | 25 | 33 | 41 |
| 5 | 18 | 26 | 34 | 19 | 27 | 35 |
| 4 | 12 | 20 | 28 | 13 | 21 | 29 |
| 3 | 6 | 14 | 22 | 7 | 15 | 23 |
| 2 | 2 | 8 | 16 | 3 | 9 | 17 |
| 1 | 0 | 4 | 10 | 1 | 5 | 11 |

TECHNIQUE TO REDUCE FG-FG INTERFERENCE IN MULTI BIT NAND FLASH MEMORY IN CASE OF ADJACENT PAGES NOT FULLY PROGRAMMED

BACKGROUND

Non-volatile memory devices, such as flash memory devices, are often used in many electronic applications. Due to high memory densities, low power consumption, non-volatility, and scalability, flash memory has become a popular option. Flash memory devices may be used in laptop computers, cellular phones, personal digital assistants (PDAs), digital cameras, media players, etc. to store data.

Flash memory data is stored as a variable amount of charge on a floating gate that floats between a control gate and a channel. The amount of charge trapped on the floating gate changes the effective threshold voltage Vt of the memory cell. The threshold voltage Vt of the memory cell determines the state of memory cell.

Programming of adjacent memory cells could change the boundary condition for the memory cell to be programmed, and increase the threshold voltage Vt needed to be programmed properly. This phenomenon is referred to as floating gate-floating gate (Fg-Fg) interference. Fg-Fg interference is dependent on 1) the coupling ratio between the memory cell to be programmed and neighboring memory cells and 2) the change in threshold voltage Vt of the neighboring memory cells. As process scaling proceeds, the memory cells are placed closer together and the coupling coefficients between adjacent memory cells become stronger, resulting in greater Fg-Fg interference.

In multilevel cell (MLC), a greater threshold voltage distribution is necessary for storing multiple bits of data. As a result, greater change in threshold voltage distribution shifts occur which in turn increases Fg-Fg interference.

BRIEF DESCRIPTION OF THE DRAWINGS

The claimed subject matter will be understood more fully from the detailed description given below and from the accompanying drawings of disclosed embodiments which, however, should not be taken to limit the claimed subject matter to the specific embodiment(s) described, but are for explanation and understanding only.

DETAILED DESCRIPTION

Figure 1:
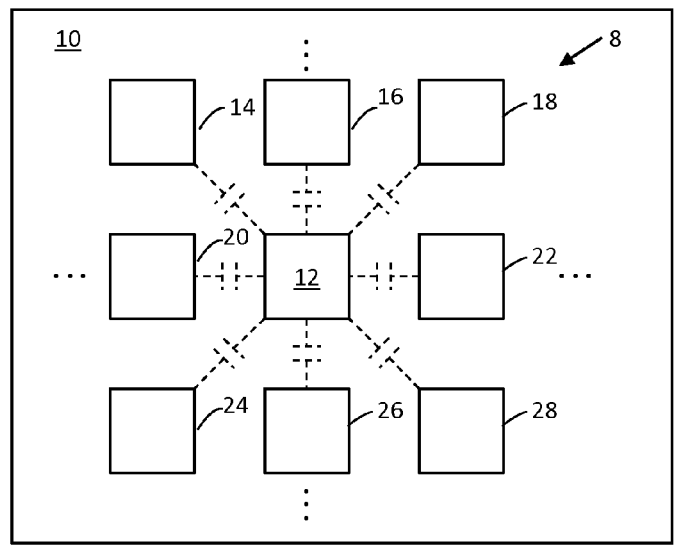
FIG. 1 shows a portion of a memory array in a memory device.

Referring to FIG. 1, a portion of a memory array 8 is shown in a memory device 10. At one particular instant, memory array 8 may include a memory cell 12 that is to be programmed ("target cell"). Target cell 12 may be surrounded by and capacitively coupled to near memory cells 14, 16, 18, 20, 22, 24, 26, and 28, which may be at various states. In general, near memory cells may include memory cells which are next to a target cell, either on the same bitline, on the same word line, or on a diagonal. As target cell 12 is being programmed, such as by placing charge on a floating gate of target cell 12, the programming process may stop when target cell 12 reaches a threshold voltage Vt corresponding to a target programmed state. Because of the capacitive coupling between target cell 12 and the near memory cells 14, 16, 18, 20, 22, 24, 26, and 28, subsequent programming of one or more of the near memory cells could change a boundary condition for target cell 12 and cause the threshold voltage Vt of target cell 12 to increase. As described before, this is known as Fg-Fg interference.

The amount of Fg-Fg interference may depend on a coupling ratio between the target cell 12 and one or more near memory cells 14, 16, 18, 20, 22, 24, 26, and 28, and on the change in the threshold voltage Vt of one or more near memory cells. Fg-Fg interference may cause problems for memory cells during programming, particularly for MLC memory cells, as further described below.

A single level cell (SLC) flash memory cell stores one bit value per cell, either a "0" programmed state or "1" erased state. The bit value is determined by the threshold voltage Vt of the memory cell. In an MLC flash memory cell, four states "00", "01", "10", "11" may be stored to hold two bits of information. The four states are determined by four levels of threshold voltage Vt. The difference (delta) between each level is decreased to fit in four states, thus the sensitivity between each level has increased. Similarly, in an MLC flash memory cell storing 3 bits of data, eight states "111", "011", "001", "101", "100", "000", "010", "110" represent data with finer sensitivity between the increased number of levels determining states. Bits of data may be stored page by page. The smallest programmable unit is a page, which may refer to a physical page or a logical page.

Figure 2:
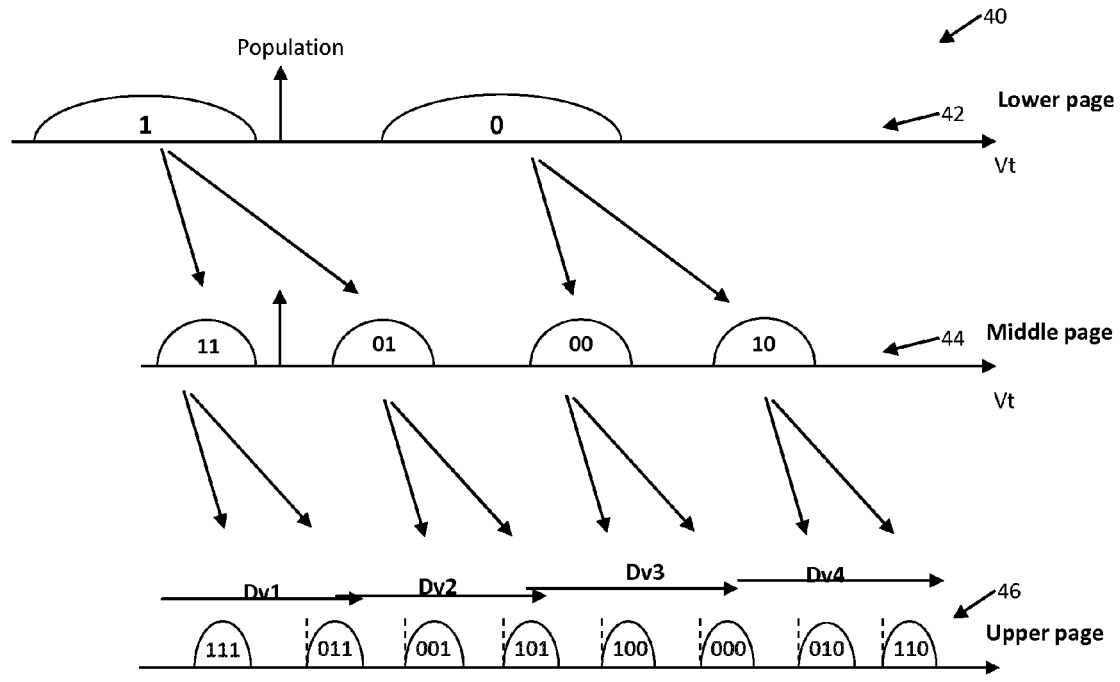
FIG. 2 shows a threshold voltage distribution of a multi-level cell (MLC) memory.

Referring to FIG. 2, a threshold voltage distribution of an MLC flash memory cell is shown at 40. According to one conventional method of programming a 3-bits per cell MLC flash memory cell, the MLC flash memory cell may have a lower page 42 that may be programmed first, a middle page 44 that may be programmed next, and an upper page 46 that may be programmed last. The lower page 42 may determine the right most bit or "least significant bit". After lower page 42 is programmed, the middle page 44 may be programmed with the next bit. Finally, the third bit of information, sometimes referred to as "most significant bit", may be programmed in the upper page 46.

To program the upper page 46, a program pulse may used to increase the threshold voltage Vt from the middle page 44 to reach a threshold voltage Vt to program the upper page 46. Upper page 46 may include 8 distributions corresponding to 8 states, each distribution at a different voltage range.

As shown in FIG. 2, programming from the middle page 44 to upper page 46, the threshold voltage distribution shifts with programming of an additional bit. This shift is also known as the delta threshold voltage Vt, and is depicted as Dv1, Dv2, Dv3, and Dv4, depending on the value of the MLC memory cell. To program upper page 46, the threshold voltage Vt needs to be higher to reach the last distributions as compared to the threshold voltage distributions of middle page 44.

Due to Fg-Fg interference, once a threshold voltage Vt is programmed into a target cell, programming adjacent pages may interfere with and increase the threshold voltage Vt of the target cell. Adjacent pages may include pages from near memory cells. In an MLC flash memory cell in which there is a greater requirement for precision in threshold voltages Vt due to the smaller delta threshold voltage Vt between levels, Fg-Fg interference can become more problematic. FIG. 2 demonstrates one solution that deals with this problem by programming the lower pages to a final state prior to programming the upper pages. In the case in which a user chooses to program an upper page without programming adjacent lower pages first, however, the delta threshold voltage Vt may accumulate causing increased Fg-Fg interference.

Figure 3:
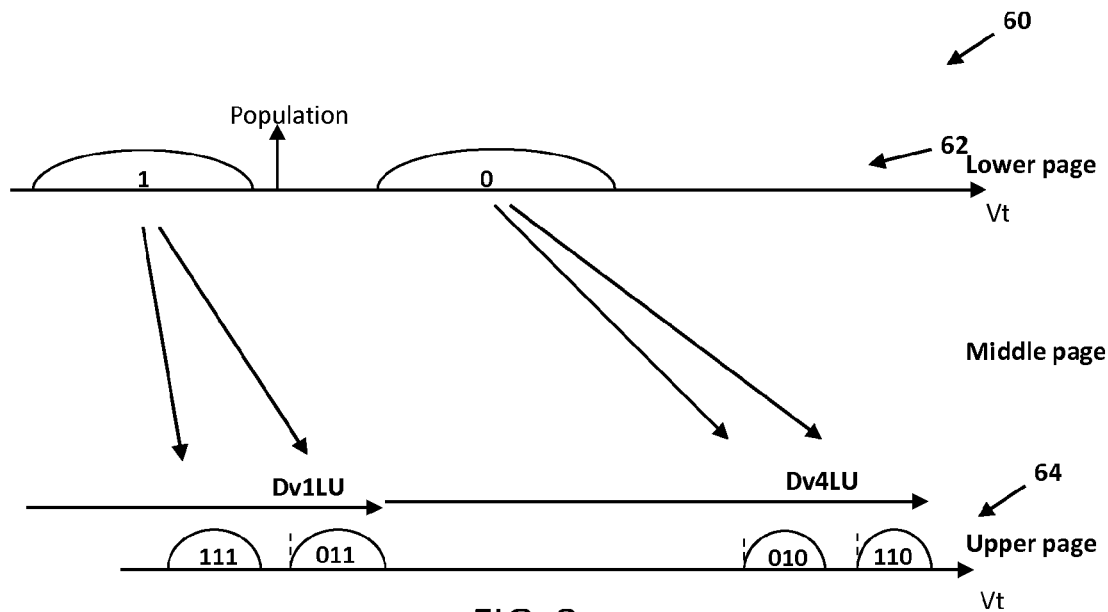
FIG. 3 shows a threshold voltage distribution of an MLC memory with an intermediate page skipped.

In FIG. 3, a threshold voltage distribution of an MLC flash memory cell is shown at 60. Threshold voltage distributions are indicated on a lower page 62 and an upper page 64 with middle page skipped during programming in this instance. As a result, the delta threshold voltages Vt, as depicted by Dv1LU and Dv4LU, may be more than double the delta threshold voltages Vt Dv1 and Dv4 of FIG. 2. The significantly larger delta voltage Vt may affect near memory cells.

It should be noted that a skipped page is not necessarily a middle page. As a non-limiting example, in an MLC flash memory cell with 4 bits per cell, any intermediate page that is not programmed before an upper page may be considered skipped. As used herein, an intermediate page may refer to a page that is located between two pages, not necessarily between an upper page and a lower page. An adjacent page may refer to another page that is next to a page being referred to, and is not limited to a lower page, a middle page, or an upper page.

Figure 4:
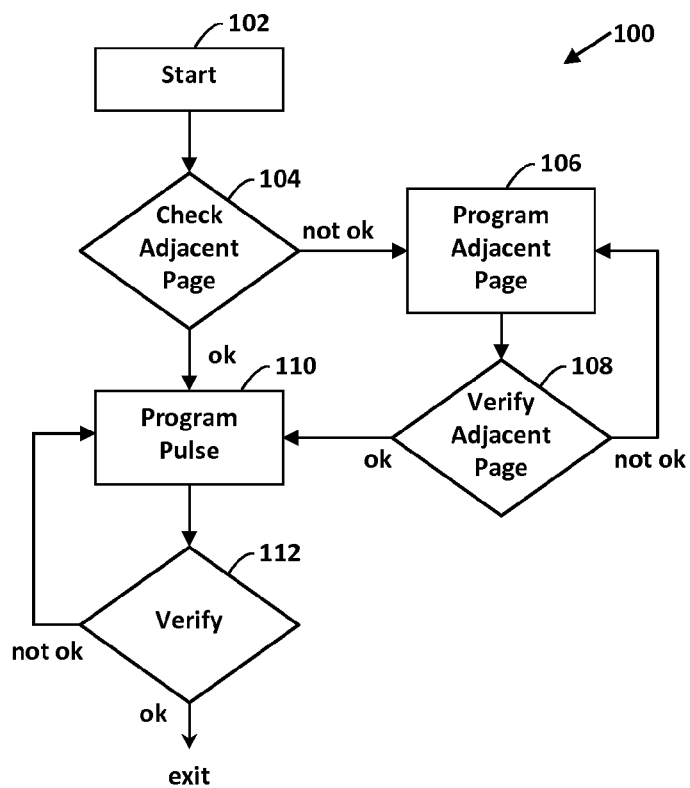
FIG. 4 is a flowchart showing a programming method according to one embodiment.

FIG. 4 is a flowchart showing a programming method 100 according to one embodiment. Programming method 100 may be used to program an MLC flash memory cell, for example, such as one with an upper page to be programmed. At block 102, programming method 100 begins, and at block 104, programming method 100 checks one or more adjacent pages to determine whether one or more adjacent pages have been programmed. In one embodiment, one or more adjacent pages are middle pages of near memory cells, but the claimed subject matter is not limited as such. In one embodiment, an adjacent page that is partially programmed is not considered programmed. In another embodiment, an adjacent page that is partially programmed is considered to be programmed. If one or more adjacent pages have not been programmed, programming method 100 proceeds to block 106 where one or more adjacent pages are programmed and followed by a verify operation, at 108. If the verify operation executes successfully, programming method 100 may proceed to program the upper page. At block 110, a program pulse may be applied to program the upper page. At block 112, programming method 100 may include verifying that the threshold voltage Vt is at the programmed voltage after the upper page receives the program pulse.

If, at block 104, a determination is made that the adjacent pages are already programmed, programming method 100 continues to block 110 where a program pulse may be applied to program the upper page. Programming method 100 continues to block 112 to verify that the threshold voltage Vt is at the proper voltage after programming. At blocks 108 and 112, if the verify is not successful, that is, the threshold voltage Vt is not at the proper level, programming method 100 may return to blocks 106 and 110 for another program pulse, respectively.

To determine whether a threshold voltage distribution is where the threshold voltage distribution should be, the verify operation may be carried out. For example, a verify operation may be done by comparing the current of the target cell and a reference cell. The voltage for the verify operation may be equal or different from a voltage for reading the target cell. In general, verification of the multilevel distributions may be performed for each page after programming.

Figures 5, 6:
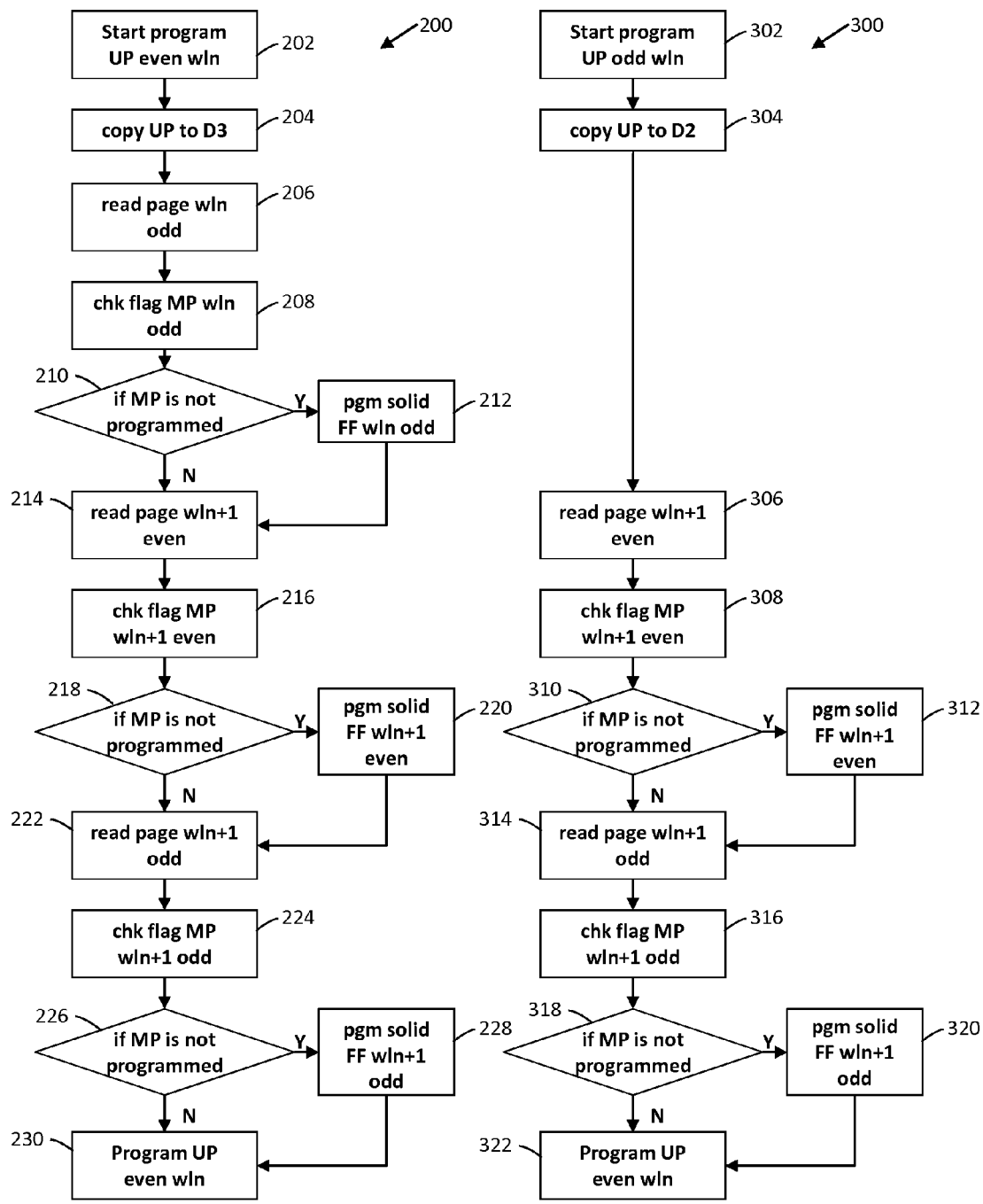
FIG. 5 is a flowchart showing an implementation of the programming method of FIG. 4 according to one embodiment.
FIG. 6 is a flowchart showing an implementation of the programming method of FIG. 4 according to one embodiment.

Turning to FIG. 5, an algorithm 200 using one implementation of the programming method of FIG. 4 is shown according to one embodiment. Starting with block 202, a user may select an upper page (UP) even word line (referred to as "target page") to program. At block 204, algorithm 200 copies UP to an internal memory element D3, which may be dynamic or static, until UP can be programmed after checking adjacent pages. At block 206, algorithm 200 reads page of word line odd, which is on the same word line as the target page. At block 208, algorithm 200 checks a flag byte of the middle page (MP) of word line odd. At block 210, a determination is made as to whether MP of word line odd is programmed. If MP is programmed, algorithm continues to block 214. If MP is not programmed, algorithm 200 proceeds to block 212 to program MP with solid FF, or in other words, erase MP of word line odd. From programming MP of word line odd, Fg-Fg interference may be reduced along the word line.

Algorithm 200 proceeds to block 214 to read page word line +1 even. At block 216, algorithm 200 checks a flag byte of the middle page (MP) of word line +1 even. At block 218, a determination is made as to whether MP of word line +1 even is programmed. If MP of word line +1 even is programmed, algorithm proceeds to block 222. If MP of word line +1 even is not programmed, algorithm 200 continues to block 220 to program MP of word line +1 even with solid FF, or in other words, erase MP of word line +1 even. From programming MP of word line +1 even, Fg-Fg interference may be reduced along the bit line.

At block 222, algorithm 200 reads page word line +1 odd. At block 224, algorithm 200 checks a flag byte of the middle page (MP) of word line +1 odd. At block 226, whether MP of word line +1 odd is programmed is determined. If MP of word line +1 odd is programmed, algorithm proceeds to block 230. If MP of word line +1 odd is not programmed, algorithm 200 continues to block 228 to program MP of word line +1 odd with solid FF, or in other words, erase MP of word line +1 odd. From programming MP of word line +1 odd, Fg-Fg interference may be reduced along a diagonal. Algorithm 200 then proceeds to block 230 where the target page UP even word line can be programmed using the stored value from internal memory element D3.

Referring to FIG. 6, similar to FIG. 5, an algorithm 300 using one implementation of the programming method of FIG. 4 is shown according to one embodiment. Starting with block 302, a user may select an upper page odd (UPo) word line (target page) to program. At block 304, algorithm 300 copies UP to an internal memory element D2, which may be dynamic or static, until UP can be programmed after checking adjacent pages. At block 306, algorithm 300 reads page of word line +1 even. At block 308, algorithm 300 checks a flag byte of the middle page (MP) of word line +1 even. At block 310, a determination is made as to whether MP of word line +1 even is programmed. If MP of word line +1 even is programmed, algorithm proceeds to block 314. If MP of word line +1 even is not programmed, algorithm 300 continues to block 312 to program MP of word line +1 even with solid FF, or in other words, erase MP of word line +1 even. From programming MP of word line +1 even, Fg-Fg interference may be reduced along the bit line.

Algorithm 300 at block 314 reads page word line +1 odd. At block 316, algorithm 300 checks a flag byte of the middle page (MP) of word line +1 odd. At block 318, whether MP of word line +1 odd is programmed is determined. If MP of word line +1 odd is programmed, algorithm proceeds to block 322. If MP of word line +1 odd is not programmed, algorithm 300 continues to block 320 to program MP of word line +1 odd with solid FF, or in other words, erase MP of word line +1 odd. From programming MP of word line +1 odd, Fg-Fg interference may be reduced along a diagonal. Algorithm 300 then proceeds to block 322 where the target page UP even word line is programmed using the stored value from internal memory element D2.

Figures 7, 8:
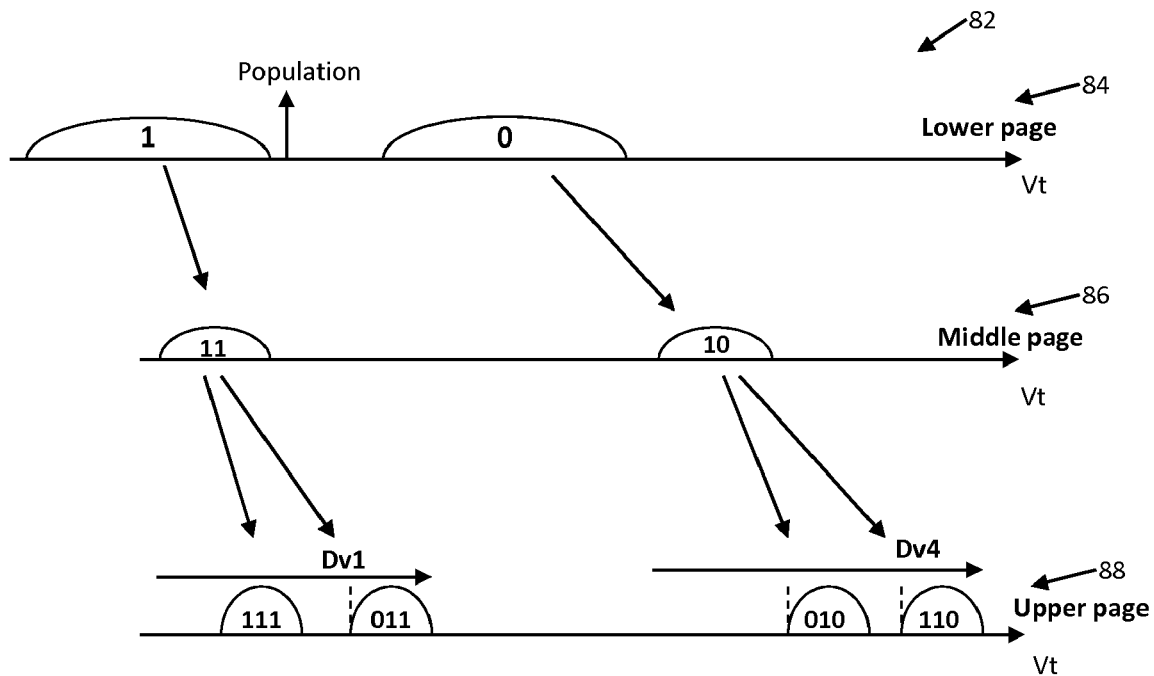
FIG. 7 is a chart of a portion of an example page-mapping sequence according to one embodiment.
FIG. 8 shows a threshold voltage distribution of a memory cell according to one embodiment.

Referring to FIG. 7, a chart of a portion of an example page-mapping sequence 70 according to one embodiment is shown for illustrative purposes. In one embodiment, the page-mapping sequence 70 assigns a certain programming order so as to limit Fg-Fg interference and/or deal with other issues. As shown, the page-mapping sequence 70 may start at 0 at the lower page even (LPe) of word line (WL) 1 and continue incrementally, alternating between even and odd bit lines, moving among memory cells.

In the case in which a user selects an upper page of a memory cell to program without following the page-mapping sequence 70. The resulting out-of-sequence order of programming may create additional Fg-Fg interference in the context of what is discussed above. According to one embodiment, the upper page may still be programmed without significantly adding Fg-Fg interference. As a non-limiting example, the user may select to program an upper page even (UPe) on WL 6, shown as 72, which should be programmed as number 40 in the page-mapping sequence 70, however, by selecting as such, the user may have skipped pages. According to programming method 100, adjacent pages are checked to determine if they have been programmed, as shown below.

Referring back to algorithm 200 of FIG. 5, the user-selected UPe of WL 6 is shown at 72. Prior to programming UPe, adjacent middle pages that have not already been programmed are checked and/or programmed. In accordance with blocks 208 and/or 212 of algorithm 200 of FIG. 5, middle page odd (MPo) of WL 6 is checked and/or programmed, shown at 74. In accordance with blocks 216 and/or 220 of algorithm 200 of FIG. 5, middle page even (MPe) of WL 7 is checked and/or programmed, shown at 76. In accordance with blocks 224 and/or 228 of algorithm 200 of FIG. 5, middle page odd (MPo) of WL 7 is checked and/or programmed, shown at 78.

If the user were to select to program an upper page odd (UPo) on WL 6, shown at 80, for example, algorithm 300 of FIG. 6 may be used. In accordance with blocks 308 and/or 312 of algorithm 300 of FIG. 6, middle page even (MPe) of WL 7 is checked and/or programmed, shown at 76. In accordance with blocks 316 and/or 320 of algorithm 300 of FIG. 6, middle page odd (MPo) of WL 7 is checked and/or programmed, shown at 78.

In one embodiment, the user may be unaware entirely of skipping pages when programming. An internal controller, as further described below, may execute methods and algorithms in accordance with one or more embodiments to reduce Fg-Fg interference.

FIG. 8 shows a threshold voltage distribution of a memory cell according to one embodiment at 82. The threshold voltage distribution includes a lower page 84, a middle page 86 and an upper page 88. Following algorithm(s) 200 and/or 300, middle page 94 is effectively not skipped at any point during programming. According to one or more embodiments, large delta threshold voltage Vt, as shown at FIG. 3, will not occur therefore Fg-Fg interference is not an issue.

Figure 9:
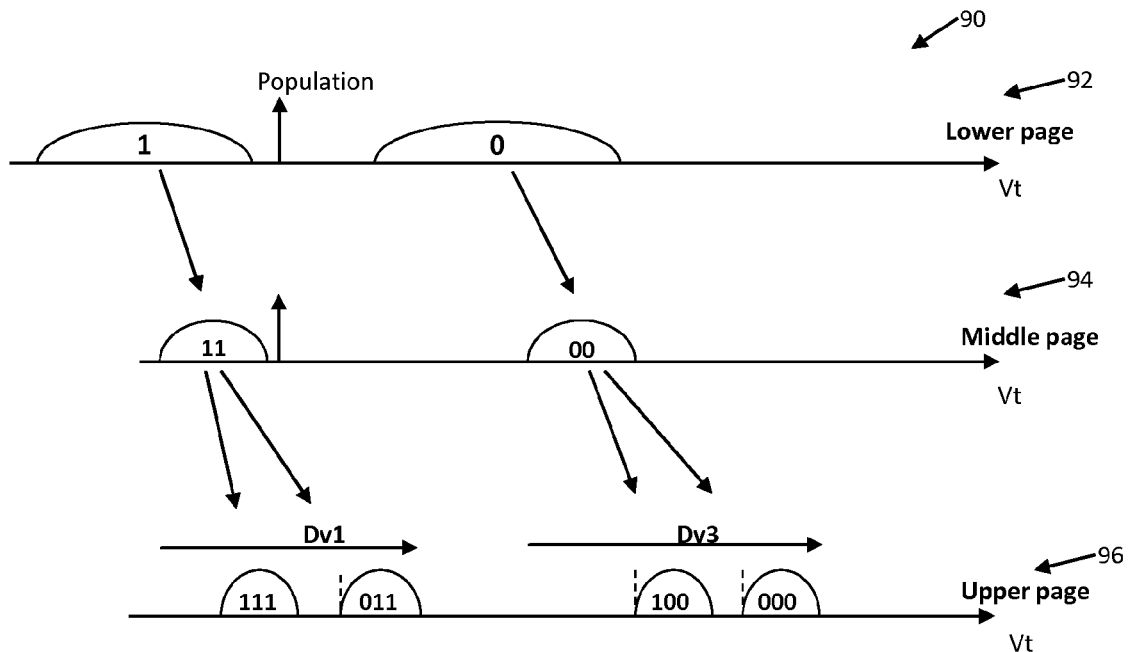
FIG. 9 shows a threshold voltage distribution of a memory cell according to one embodiment.

FIG. 9 shows a threshold voltage distribution of a memory cell according to one embodiment at 90. Similar to FIG. 8, the threshold voltage distribution includes a lower page 92, a middle page 94 and an upper page 96. Following algorithm(s) 200 and/or 300, middle page 94 is effectively not skipped at any point during programming. In another example implementation of FIGS. 4-6, during programming of a middle page such as in blocks 212, 220, 228, 312, and 320, there is an alternative to programming with solid FF if it is determined that the middle page has not been programmed. In one embodiment, algorithms 200 and 300 may program with a "1" or a "0" depending on what is read. For example, the middle pages may be programmed "11" and "00" such as shown in FIG. 9. A no program flag may be used to indicate that the middle page was not programmed. According to one or more embodiments, large delta threshold voltage Vt, as shown at FIG. 3, will not occur therefore Fg-Fg interference is not problematic.

Figure 10:
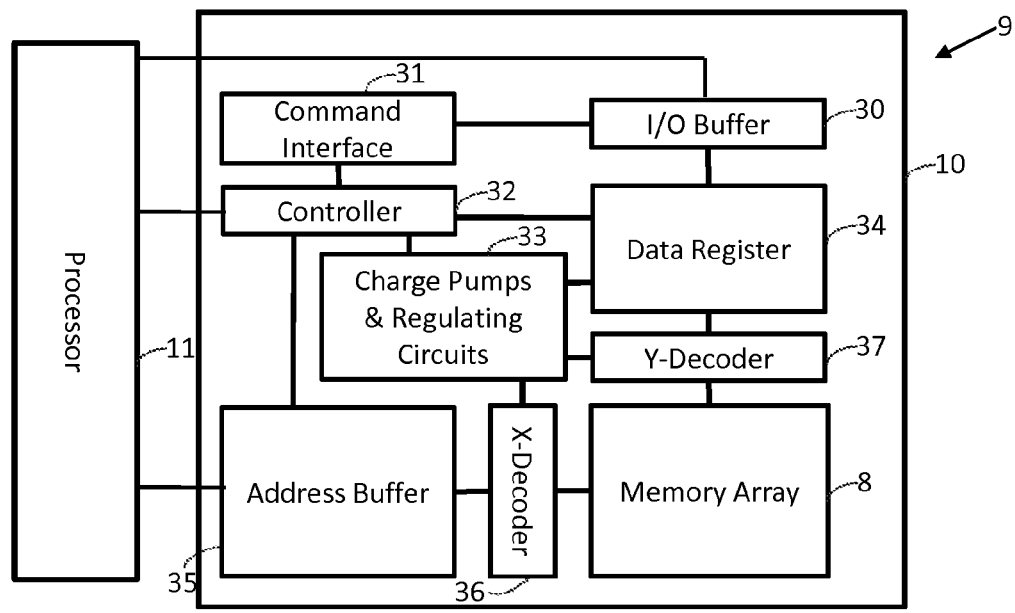
FIG. 10 is a block diagram of an electronic system according to one embodiment.

Referring to FIG. 10, an electronic system according to one embodiment is shown at 9. Electronic system 9 may include a memory device 10 and a processor 11 in communication with memory device 10. Processor 11 may be a microprocessor or some other type of controlling circuitry, and may be capable of performing mathematical operations, moving data from one memory location to another, and/or make decisions and jump to follow new instructions. In one embodiment, electronic system 9 may include a medium having machine-readable instructions stored thereon for execution by a processor, that if executed by the processor, the machine-readable instructions cause the processor to perform one or more methods and/or algorithms above. Electronic system 9 is simplified as shown, but it should be understood electronic system 9 may include additional components.

In one or more embodiments, memory device 10 may also be programmed with one or more methods and algorithms as discussed above. The memory device 10 may be further programmed with data, read to retrieve data, and erased to clear the memory device. Memory device 10 includes an input/output (I/O) buffer 30, a command interface 31, a controller 32, charge pumps and other regulating circuits 33, a data register 34, an address buffer 35, x-decoder 36, y-decoder 37, and a memory array 8, shown in FIG. 1. Other embodiments of the memory device may include additional components or omit some of those illustrated in FIG. 10.

The I/O buffer 30 may be configured to receive input and output and act as an external interface. The I/O buffer 30 may hold inputted commands for controlling the memory device 10, address information, data to be entered into the memory array 8, and data retrieved from the memory array 8. The I/O buffer 30 may then send data to other components in the memory device 10. Commands are sent to the command interface 31. The command interface 31 receives and recognizes user input commands and directions. The command interface 31 further activates the controller 32.

The controller 32 is responsible for running the other components of the memory device 10 for programming and erasing of the memory array 8. The controller 32 may include a state machine for dedicated reading, erasing, and programming operations using operation code. In one or more embodiments, the state machine of controller 32 may execute programming methods and/or algorithms as disclosed in FIGS. 4-7 for programming. The programming methods and/or algorithms may be embedded in controller 32 or on memory device 10.

Controller 32 further communicates with the charge pumps and other regulating circuits 33 to provide bias voltages and sustain dynamic or static loads during different operating conditions to the memory array 8. Other regulating circuits may include clocking circuits, and other peripheral circuits for operating the memory device 10. The charge pumps and other regulating circuits 33 also provide voltages to memory components that may require regulated voltages.

Data register 34 is capable of sensing data from the memory array 8, storing user input from the I/O buffer 30, and driving bit lines in the memory array 8. Data register 34 may store data immediately prior to programming or immediately after reading from the memory array 8.

The controller 32 sends address information corresponding to one or more memory cells of the memory array 8 to the address buffer 35 for programming and/or erasing of the memory cell(s). The address buffer 35 holds the addresses which are used to access the memory array 8. In response to a received address, the x-decoder 36 selects one or more rows of the memory array 8 for access. Similarly, upon receipt of an address, the y-decoder 37 selects one or more columns of the memory array 8 for access.

As shown in FIGS. 10 and 1, memory device 10 is depicted with a NAND flash memory array 8, which is an erasable and programmable non-volatile memory. A NAND flash memory array 8 includes memory cells serially connected between a drain selection transistor and a source selection transistor. Memory array 8 may include memory cells organized in blocks, pages, sectors, rows, and columns, etc. Each memory cell may be individually read and programmed. Blocks of data may be accessed in pages by the data register 34 and temporarily stored in the data register 34. Memory device 10 is not limited to what is shown and may include other components, but is simplified herein for illustrative purposes.

It should be known that FIGS. 2, 3, 8 and 9 illustrating threshold voltage distributions are not meant to be limited to the convention shown. For example, in another convention, the bit order or sequence may be different. The figures are intended to compare and contrast the threshold voltage distribution shifts.

It is appreciated that a technique of reducing Fg-Fg interference in multi bit NAND flash memory has been explained with reference to one or more exemplary embodiments, and that the claimed subject matter is not limited to the specific details given above. References in the specification made to other embodiments fall within the scope of the claimed subject matter.

Any reference to device may include a component, circuit, module, or any such mechanism in which the device can achieve the purpose or description as indicated by the modifier preceding the device. The component, circuit, module, or any such mechanism is, however, not necessarily a specific limitation to the device.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may," "might," or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the claimed subject matter. Indeed, the claimed subject matter is not limited to the details described above. Rather, it is the following claims including any amendments thereto that define such scope and variations.

What is claimed is:

1. A method for reducing floating gate-floating gate interference in programming memory, the method comprising:
   during programming of an upper page of a memory cell, determining whether one or more adjacent pages of the memory cell has been programmed;
   if the one or more adjacent pages is not programmed, programming with a selected threshold voltage each adjacent page of the memory cell that is determined to be not programmed; and
   programming the upper page of the memory cell.

2. The method of claim 1, wherein the memory cell is capable of holding 3 or more bits of data.

3. The method of claim 1, wherein the one or more adjacent pages of the memory cell is an intermediate page of near memory cells of the memory cell.

4. The method of claim 3, wherein the one or more adjacent pages is a middle page of near memory cells of the memory cell.

5. The method of claim 1, wherein the selected threshold voltage of each adjacent page of the memory cell programmed corresponds to an "FF".

6. The method of claim 1, wherein the selected threshold voltage of each adjacent page of the memory cell programmed corresponds to a "11".

7. The method of claim 1, wherein the selected threshold voltage of each adjacent page of the memory cell programmed corresponds to a "00".

8. The method of claim 1, further comprising determining whether a flag byte associated with an adjacent page of the memory cell indicates whether the adjacent page has been programmed.

9. The method of claim 1, further comprising verifying the programming of the upper page of the memory cell.

10. The method of claim 1, further comprising storing data to be programmed into the upper page in a first location prior to programming the upper page of the memory cell.

11. A memory, comprising:
    a memory array of one or more memory cells;
    an internal controller capable of programming an upper page of a memory cell by determining whether one or more adjacent pages of the memory cell have been programmed, if the one or more adjacent pages has not been programmed, programming with a selected threshold voltage each adjacent page of the memory cell that is determined to be not programmed, and programming the upper page of the memory cell.

12. The memory of claim 11, wherein the internal controller is further capable of determining whether a flag byte associated with an adjacent page to the memory cell indicates whether the adjacent page has been programmed.

13. The memory of claim 11, wherein one or more memory cells of the memory array comprise multilevel cells.

14. The memory of claim 11, wherein one or more memory cells of the memory array comprise two or more pages.

15. A non-transient medium having machine-readable instructions stored thereon for execution by a processor, wherein, if executed by the processor, the machine-readable instructions cause the processor to perform a method comprising:

during programming of an upper page of a memory cell, determining whether one or more adjacent pages of the memory cell has been programmed;

if the one or more adjacent pages is not programmed, programming with a selected threshold voltage each adjacent page of the memory cell that is determined to be not programmed; and programming the upper page of the memory cell.

16. The non-transient medium of claim 15, further comprising verifying that a threshold voltage of one or more adjacent pages of the memory cell is at the proper voltage after programming the one or more adjacent pages.

17. The non-transient medium of claim 15, wherein the one or more adjacent pages are middle pages of near memory cells of the memory cell.

18. The non-transient medium of claim 15, wherein programming the one or more adjacent pages of the memory cell comprises erasing a middle page of the one or more adjacent pages.

19. The non-transient medium of claim 15, wherein the selected threshold voltage of each adjacent page of the memory cell programmed corresponds to a "11".

20. The non-transient medium of claim 15, wherein the selected threshold voltage of each adjacent page of the memory cell programmed corresponds to a "00".

* * * * *